United States Patent [19]

Chong et al.

[11] Patent Number: 5,083,179
[45] Date of Patent: Jan. 21, 1992

[54] CMOS SEMICONDUCTOR INTEGRATED CIRCUIT DEVICE

[75] Inventors: Teek F. Chong, Yokohama; Takahiro Ito, Yokosuka, both of Japan

[73] Assignee: Kabushiki Kaisha Toshiba, Kawasaki, Japan

[21] Appl. No.: 661,013

[22] Filed: Feb. 26, 1991

[30] Foreign Application Priority Data

Feb. 27, 1990 [JP] Japan .................................. 2-46230

[51] Int. Cl.$^5$ ........................................... H01L 27/02
[52] U.S. Cl. ..................................... 357/42; 357/52; 357/54; 357/55
[58] Field of Search ........................ 357/42, 52, 54, 55

[56] References Cited

U.S. PATENT DOCUMENTS 4,969,029  11/1990  Ando et al. ............................ 357/42

FOREIGN PATENT DOCUMENTS 64-89557  4/1989  Japan .

Primary Examiner—Edward J. Wojciechowicz
Attorney, Agent, or Firm—Finnegan, Henderson, Farabow, Garrett, and Dunner

[57] ABSTRACT

In a CMOS semiconductor integrated circuit device, an element isolating insulation film is formed on an N-type epitaxial layer deposited on an N-type semiconductor substrate, and two CMOS circuits are arranged in a region surrounded by the element isolating insulation film. Each of the CMOS circuits includes a P-channel MOS transistor and an N-channel MOS transistor. The source region of the P-channel MOS transistor of one of the CMOS circuits at the final stage is connected to a power source through a first feed path constituted of a metal wiring layer formed on the semiconductor substrate. The source of the P-channel MOS transistor of the other CMOS circuit is connected to the power source through the semiconductor substrate, the epitaxial layer, and an N-type semiconductor region formed on the epitaxial layer.

7 Claims, 3 Drawing Sheets

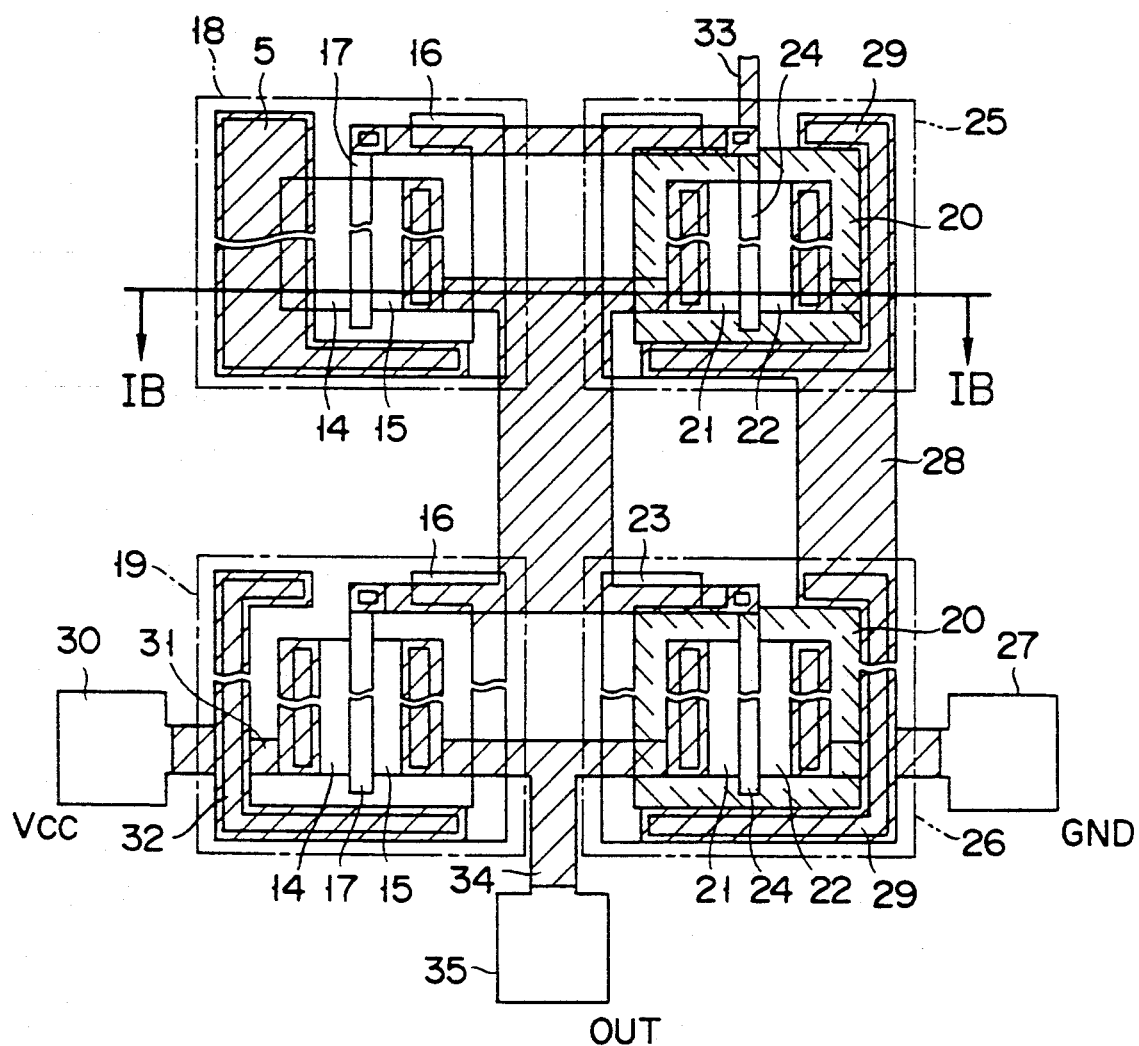
F I G. 1A

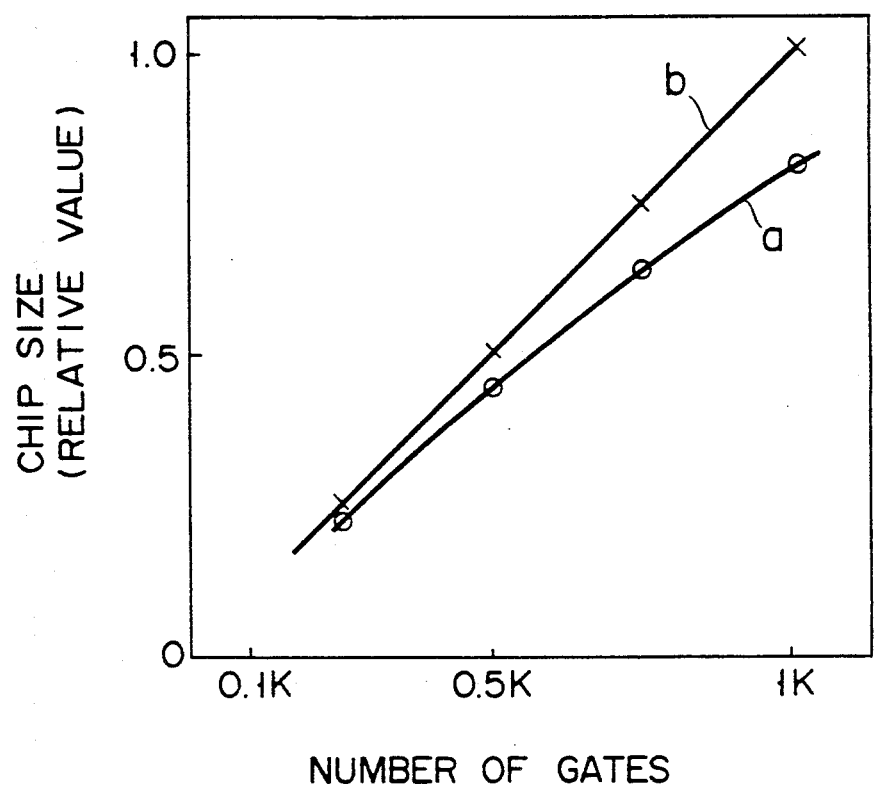
F I G. 2

CMOS SEMICONDUCTOR INTEGRATED CIRCUIT DEVICE

BACKGROUND OF THE INVENTION

1. Field of the Invention

The present invention relates to a CMOS semiconductor integrated circuit device including inverter circuits of a plurality of output stages.

2. Description of the Related Art

A conventional CMOS semiconductor integrated circuit device having inverter circuits of a plurality of output stages is so constructed that a high electric potential is applied to the source regions of a plurality of P-channel MOS transistors through a common metal wiring layer formed on a substrate. The conventional device has a problem in which the degree of freedom of circuit arrangement is restricted. Moreover, the following problem arises. The final output stage whose output current capacity is large, is connected to a high-potential pad through the metal wiring layer as a feed path common to those of the other output stages. Therefore, an instantaneous variation in power source voltage caused when the final output stage is turned on or off, varies a voltage applied to the other circuits connected by the metal wiring layer, resulting in generation of switching noise and malfunction.

As a technique of eliminating the above problems, Published Unexamined Japanese Patent Application No. 64-89557 discloses a circuit arrangement in which a voltage is applied to the source region of a P-channel MOS transistor through a substrate. This circuit arrangement has the advantage of miniaturizing a device since the circuit arrangement is not restricted by a metal wiring layer and the advantage of suppressing generation of switching noise since the substrate has a large capacitance. In the arrangement, however, when the voltage is applied to a stage whose power consumption is high, such as the final stage, an operation speed of the stage is decreased since the resistance of the substrate comes to affect the speed.

SUMMARY OF THE INVENTION

The present invention has been made in consideration of the above situation and has as its object to provide a CMOS semiconductor integrated circuit device capable of satisfying conflicting desires for improving the degree of freedom of circuit arrangement and reducing switching noise, and increasing an operation speed.

To attain the above object, there is provided a CMOS semiconductor integrated circuit device, comprising:

a semiconductor substrate of a first conductivity type;

an element isolating insulation film formed on the semiconductor substrate;

a plurality of CMOS circuits formed on the semiconductor substrate and surrounded by the element isolating insulation film, each of the CMOS circuits including a P-channel MOS transistor and an N-channel MOS transistor;

a first feed path, formed so as to pass through a metal wiring layer formed on the semiconductor substrate, for applying a voltage to at least one of the CMOS circuits which has high power consumption; and a second feed path, formed so as to pass through the semiconductor substrate, for applying a voltage to the other CMOS circuits.

According to the present invention, in a CMOS logic circuit, a first feed path including an electrode pad and a metal wiring layer connecting thereto is used to connect a high electric potential pad to the final output stage, and a second feed path including a semiconductor substrate, an epitaxial layer, and a semiconductor region of the same conductivity type as that of the substrate is used to connect the high electric potential pad to internal circuits other than the final output stage.

No metal wiring layers for applying a Vcc voltage to the internal circuits need to be formed and therefore the degree of freedom of the circuit arrangement is increased. A variation in electic potential caused by turning on and off the final output stage having a large output current capacity, does not adversely affect the other output stages.

Even when a voltage is applied to a stage having high power consumption, such as the final stage, an operation speed of the stage does not decrease since the first feed path including the electrode pad and the metal wiring layer connecting thereto is used.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1A is a plan view showing the arrangement of a CMOS semiconductor integrated circuit device according to the present invention;

FIG. 2 is a graph showing chip sizes of the device of the present invention and the prior art device with respect to the number of gates.

DETAILED DESCRIPTION OF THE PREFERRED EMBODIMENTS

Figure 1B:
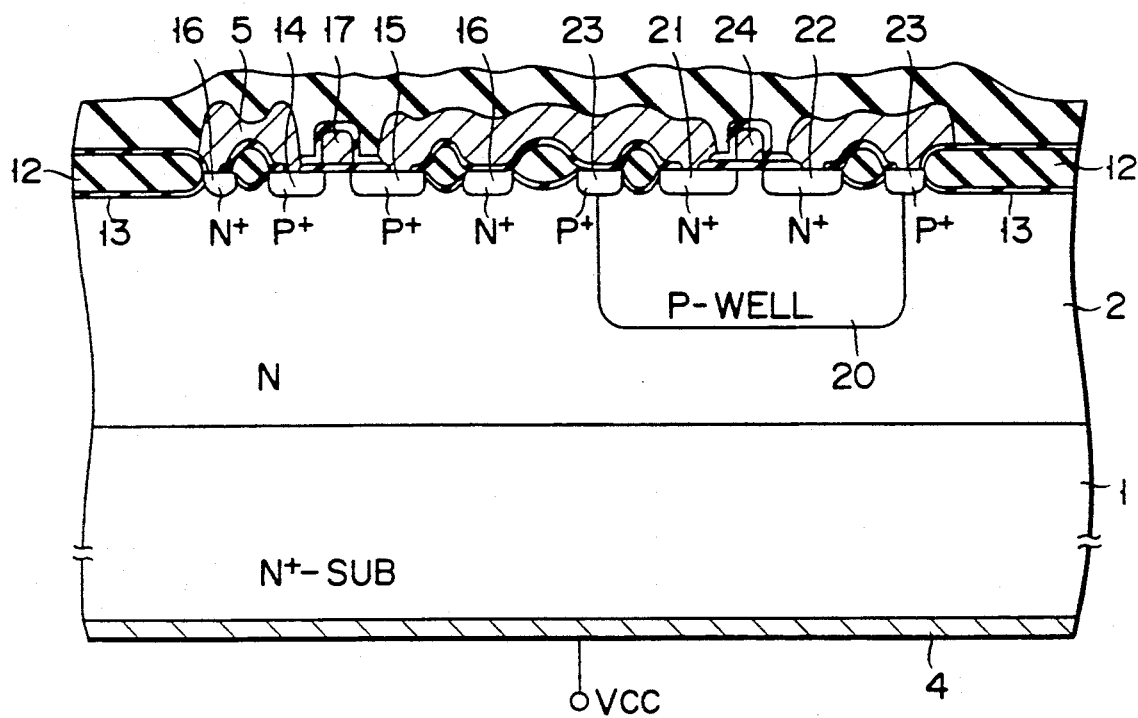
FIG. 1B is a cross-sectional view taken along a line 1B—1B of FIG. 1A.

As shown in FIGS. 1A and 1B, a CMOS semiconductor integrated circuit device according to the present invention comprises two pairs of inverter circuits which are connected in series.

A substrate 1 is an N+-type silicon semiconductor substrate which is doped with a high-concentration N-type impurity. An N-type epitaxial layer 2 is deposited on the substrate 1 by the CVD method. A field insulating film 12 and a channel stopper layer 13 are formed on the epitaxial layer 2 to isolate an element region.

The surface of the epitaxial layer 2 is doped with a high-concentration P-type impurity to form P+-type source and drain regions 14 and 15 thereon. Further, a high-concentration N-type impurity is doped around the source and drain regions 14 and 15 to form an N+-type guard ring diffusion region 1 with the insulating film interposed therebetween. A gate insulating film is formed on a channel region between the source and drain regions 14 and 15, and a gate electrode 17 is then formed on the gate insulating film.

Thus, two P-channel MOS transistors 18 and 19 are formed, as indicated by a one-dot-one-dash line in FIG. 1A.

A P-type well region 20 is formed on the surface of the epitaxial layer 2, and the surface is doped with the high-concentration N-type impurity to form N+-type source and drain regions 22 and 21 thereon. Further, a high-concentration P-type impurity is doped around the source and drain regions 22 and 21 to form a P+-type guard ring diffusion region 23 with the insulating film interposed therebetween. A gate insulating film is formed on a channel region between the source and drain regions 22 and 21, and a gate electrode 24 is then formed on the gate insulating film.

Thus, two N-channel MOS transistors 25 and 26 are formed, as indicated by a one-dot-two-dashes line in FIG. 1A.

A low electric potential (GND) pad 27 is connected to the source regions 22 of the two N-channel MOS transistors 25 and 26 and also connected to substrate contacts 29 on the guard ring diffusion regions 23 thereof.

A path connecting a high electric potential (Vcc) pad 30 to a CMOS inverter circuit constituted of the transistors 18 and 25 differs from a path connecting the pad 30 to a CMOS inverter circuit of the final output stage constituted of the transistors 19 and 26. More specifically, the P-channel MOS transistor 19 is so arranged that a power source voltage is applied from the pad 30 to the source region 14 through a metal wiring layer 31, and the P-channel MOS transistor 18 is so arranged that the power source voltage is applied from the pad 30 to the substrate 1 through a lead frame 4, then applied to the guard ring diffusion region 16 through the epitaxial layer 2, and applied to the source region 14 through a metal wiring layer 5 formed over the guard ring diffusion regions 16 and 14.

An output of the CMOS inverter circuit constituted of the P- and N-channel MOS transistors 18 and 25 is supplied to the CMOS inverter circuit constituted of the P- and N-channel MOS transistors 19 and 26. The transistors 18 and 25 are turned on and off in accordance with the level of a gate input terminal, and the transistors 19 and 26 are turned on and off in accordance with the output level of the CMOS inverter circuit constituted of the transistors 18 and 25. An output of the CMOS inverter circuit constituted of the transistors 19 and 26 is supplied to an output pad 35 through a metal wiring layer 34.

The transistors other than the final output stage may have small current capacity. In the above embodiment, therefore, the resistance of the substrate 1 is relatively decreased, a drop of voltage from the power source is suppressed as much as possible, and the same voltage as that applied from the pad 30 to the final output stage through the metal wiring layer 31 is applied from the substrate to the transistors of the output stages other than the final output stage.

It is thus unnecessary to extend the metal wiring layer to apply the Vcc power source voltage to all the transistor on the substrate when the device is arranged. It is necessary only to form a feeding path of the final output stage having a large current capacity as a metal wiring layer on the substrate. Consequently, the degree of freedom of the circuit arrangement is increased and the pattern design is easy.

FIG. 2 is a graph showing chip sizes of the device of the present invention and the conventional device capable of applying a voltage to each output stage using a metal wiring layer formed on the substrate. In FIG. 2, a 1k-gate device (a semiconductor chip having about 1000 gate circuits) is used by way of example, and the size of the conventional 1k-gate device is set to 1.0 as a relative value. The sizes of the devices, with respect to the number of gates, are thus shown in FIG. 2 in which line a denotes the present invention and line b indicates the conventional device. When the number of gates is 1k, the chip size of the present invention is 85% of that of the conventional device. Therefore, the present invention greatly contributes to reduction in chip size.

Since a path connecting the high electric potential pad to the final output stage having a large current capacity differs from a path connecting the pad to an internal circuit of the other output stage having a small current capacity, a variation in electric potential caused by turning on and off the final output stage does not adversely affect the other output stages so greatly and accordingly the malfunction of the device due to noise can be prevented.

The present invention is not limited to the above embodiment. For example, when a P-type silicon semiconductor substrate is used in place of the N-type silicon semiconductor substrate, the conductivity types of all regions to be formed, such as the channel region, are reversed. Then, a path connecting the GND pad to the final output stage and a path connecting the GND pad to the other output stages are formed to differ from each other.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A CMOS semiconductor integrated circuit device, comprising:

a semiconductor substrate of a first conductivity type;

an element isolating insulation film formed on said semiconductor substrate;

a plurality of CMOS circuit formed on said semiconductor substrate and surrounded by said element isolating insulation film, each of said CMOS circuits including a P-channel MOS transistor and an N-channel MOS transistor;

a first path of high electric potential for applying a voltage to at least one of said CMOS circuits which has high power consumption, said first path being constructed by first metal wiring layer means formed on said semiconductor substrate and connecting the source region of a P-channel MOS transistor of said at least one of said CMOS circuits to high electric potential terminal means;

a second path of high electric potential for applying a voltage to other CMOS circuits having lower power consumption, said second path being constructed by said semiconductor substrate with first connecting means for connecting said substrate to a high electric potential terminal means, and second connecting means for connecting said substrate to the source regions of P-channel MOS transistors of said other CMOS circuits; and a third path of low electric potential constructed by second metal wiring layer means formed on said semiconductor substrate and connecting the source regions of N-channel MOS transistors of all said CMOS circuits to low potential means.

2. The CMOS semiconductor integrated circuit device according to claim 1, wherein said CMOS circuits are formed on an epitaxial layer deposited on said semiconductor substrate.

3. The CMOS semiconductor integrated circuit device according to claim 1, wherein said first conductivity type is an N conductive type.

4. The CMOS semiconductor integrated circuit device according to claim 1, wherein said second connecting means includes a semiconductor region of the first conductivity type and a wiring layer, both of which are formed on said semiconductor substrate and in the P-channel MOS transistor of each of said other CMOS circuits.

5. The CMOS semiconductor integrated circuit device according to claim 4, wherein said CMOS circuits are inverter circuits.

6. The CMOS semiconductor integrated circuit device according to claim 5, wherein said first path is used for applying a voltage to an inverter circuit of a final one of the output stages, and said second path is used for applying a voltage to other inverter circuits.

7. The CMOS semiconductor integrated circuit device according to claim 1, wherein said first and second paths have the same electric potential.

* * * * *